United States Patent
Wang et al.

(10) Patent No.: US 11,971,365 B2
(45) Date of Patent: Apr. 30, 2024

(54) WAFER PROCESSING SYSTEM AND REWORK METHOD THEREOF

(71) Applicant: GlobalWafers Co., Ltd., Hsinchu (TW)

(72) Inventors: Shang-Chi Wang, Hsinchu (TW); Cheng-Jui Yang, Hsinchu (TW); Miao-Pei Chen, Hsinchu (TW); Han-Zong Wu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 136 days.

(21) Appl. No.: 17/569,510

(22) Filed: Jan. 6, 2022

(65) Prior Publication Data

US 2022/0326162 A1 Oct. 13, 2022

(30) Foreign Application Priority Data

Apr. 12, 2021 (TW) ................. 110113029

(51) Int. Cl.
*G01N 21/95* (2006.01)
*H01L 29/16* (2006.01)

(52) U.S. Cl.
CPC ..... *G01N 21/9501* (2013.01); *H01L 29/1608* (2013.01)

(58) Field of Classification Search
CPC ............ G01N 21/9501; H01L 29/1608; H01L 21/02032; H01L 22/20; H01L 21/02035; H01L 22/26; B24B 29/02; B24B 37/005; B24B 37/042; B24B 49/12; B24B 51/00; B28D 5/00; B28D 5/0064
See application file for complete search history.

(56) References Cited

U.S. PATENT DOCUMENTS

| | | | | |
|---|---|---|---|---|
| 4,482,424 A | * | 11/1984 | Katzir | G03F 7/30 216/60 |
| 5,450,205 A | * | 9/1995 | Sawin | H01J 37/32935 216/60 |
| 5,940,175 A | * | 8/1999 | Sun | G01N 21/9501 356/237.3 |
| 6,313,903 B1 | * | 11/2001 | Ogata | H01L 21/67253 396/311 |
| 7,315,361 B2 | * | 1/2008 | Schramm | G01N 21/956 356/237.1 |
| 10,559,508 B2 | * | 2/2020 | Kimura | H01L 21/02378 |
| 2002/0088952 A1 | * | 7/2002 | Rao | G01N 21/9501 250/559.45 |
| 2002/0188917 A1 | * | 12/2002 | Yokoyama | G01N 21/9501 382/145 |

(Continued)

FOREIGN PATENT DOCUMENTS

CN 111554591 A * 8/2020
JP 2007149837 A * 6/2007

(Continued)

*Primary Examiner* — Mohamed K Amara
(74) *Attorney, Agent, or Firm* — JCIPRNET

(57) ABSTRACT

A wafer processing system and a rework method thereof are provided. An image capture device captures an image of a wafer to generate a captured image. A control device detects a defect pattern in the captured image, calculates a target removal thickness according to distribution of contrast values of the defect pattern, and controls a processing device to perform processing on the wafer according to the target removal thickness.

12 Claims, 4 Drawing Sheets

(56) References Cited

U.S. PATENT DOCUMENTS

| | | | | |
|---|---|---|---|---|
| 2006/0192973 A1* | 8/2006 | Aiyer | ................ | G01B 11/0641 |
| | | | | 356/487 |
| 2011/0205556 A1* | 8/2011 | Sakai | ................ | G01B 11/0625 |
| | | | | 356/630 |
| 2013/0208269 A1* | 8/2013 | Cai | .................... | G01N 21/9501 |
| | | | | 356/237.5 |
| 2016/0379900 A1* | 12/2016 | Maehr | ............... | H01L 21/67051 |
| | | | | 118/712 |
| 2020/0388025 A1* | 12/2020 | Tsuruda | .................... | G06T 7/60 |
| 2021/0183712 A1* | 6/2021 | Enomoto | .......... | H01L 21/67253 |

FOREIGN PATENT DOCUMENTS

| | | |
|---|---|---|
| TW | 485093 | 5/2002 |
| TW | 201946136 | 12/2019 |

* cited by examiner

WAFER PROCESSING SYSTEM AND REWORK METHOD THEREOF

CROSS-REFERENCE TO RELATED APPLICATION

This application claims the priority benefit of Taiwan application serial no. 110113029, filed on Apr. 12, 2021. The entirety of the above-mentioned patent application is hereby incorporated by reference herein and made a part of this specification.

BACKGROUND

Technical Field

The disclosure relates to a processing device, and more particularly to a wafer processing system and a rework method thereof.

Description of Related Art

In the prior art, when a scratch is found on a silicon carbide wafer, rework is generally required for the quality of the wafer to meet the requirements of the customer. However, since depths of scratches on a wafer surface are not consistent, and different customers have different requirements for the quality of the wafer, it is necessary to repeatedly check whether the requirements of the customer have been met during a rework process. Since there is currently no effective way to effectively predict the results of rework, it is easy to cause waste of processing time and material cost.

SUMMARY

The disclosure provides a wafer processing system, which can accurately predict the amount of rework and the time of rework to effectively avoid waste of processing time and material cost.

A wafer processing system of the disclosure includes an image capture device, a processing device, and a control device. The image capture device captures an image of a wafer to generate a captured image. The control device is coupled to the image capture device and the processing device, detects a defect pattern in the captured image, calculates a target removal thickness according to distribution of contrast values of the defect pattern, and controls the processing device to perform a processing on the wafer according to the target removal thickness.

In an embodiment of the disclosure, the control device determines a contrast value reduction amount of the defect pattern according to a defect pattern total length threshold and the distribution of the contrast values of the defect pattern, and controls the processing device to perform the processing on the wafer according to the contrast value reduction amount, so that a total length of the defect pattern is less than or equal to the defect pattern total length threshold.

In an embodiment of the disclosure, the control device calculates the target removal thickness according to the contrast value reduction amount and a contrast value change amount of at least one standard wafer after removing a unit thickness of the at least one standard wafer.

In an embodiment of the disclosure, the control device estimates a time for the processing device to perform the processing according to a thickness removal rate of the wafer.

In an embodiment of the disclosure, the contrast value change amount is calculated according to statistical data of multiple contrast value change amounts obtained after removing a unit thickness of multiple standard wafers.

In an embodiment of the disclosure, the wafer is a silicon carbide wafer.

In an embodiment of the disclosure, the contrast value of the defect pattern indicates a defect depth of the defect pattern.

In an embodiment of the disclosure, the contrast value includes at least one of a grayscale contrast value, a lightness contrast value, and a brightness contrast value.

The disclosure also provides a rework method of a wafer processing system, which includes the following steps. An image of a wafer is captured to generate a captured image. A defect pattern in the captured image is detected. A target removal thickness is calculated according to distribution of contrast values of the defect pattern. A processing is performed on the wafer according to the target removal thickness.

In an embodiment of the disclosure, the rework method of the wafer processing system includes the following step. A contrast value reduction amount of the defect pattern is determined according to a defect pattern total length threshold and the distribution of the contrast values of the defect pattern, and the processing is performed on the wafer according to the contrast value reduction amount, so that a total length of the defect pattern is less than or equal to the defect pattern total length threshold.

In an embodiment of the disclosure, the rework method of the wafer processing system includes the following step. The target removal thickness is calculated according to the contrast value reduction amount and a contrast value change amount of at least one standard wafer after removing a unit thickness of the at least one standard wafer.

In an embodiment of the disclosure, the rework method of the wafer processing system includes the following step. A time for performing the processing is estimated according to a thickness removal rate of the wafer.

In an embodiment of the disclosure, the contrast value change amount is calculated according to statistical data of multiple contrast value change amounts obtained after removing a unit thickness of multiple standard wafers.

In an embodiment of the disclosure, the wafer is a silicon carbide wafer.

In an embodiment of the disclosure, the contrast value of the defect pattern indicates a defect depth of the defect pattern.

In an embodiment of the disclosure, the contrast value includes at least one of a grayscale contrast value, a lightness contrast value, and a brightness contrast value.

Based on the above, in the embodiments of the disclosure, the target removal thickness is calculated according to the distribution of the contrast values of the defect pattern in the captured image, and the processing device is controlled to perform processing on the wafer according to the target removal thickness to ensure that the quality of the wafer after performing rework processing can meet the requirements of the customer and avoid repeated inspections during the rework process to avoid waste of processing time and material cost.

DETAILED DESCRIPTION OF DISCLOSED EMBODIMENTS

Figure 1:
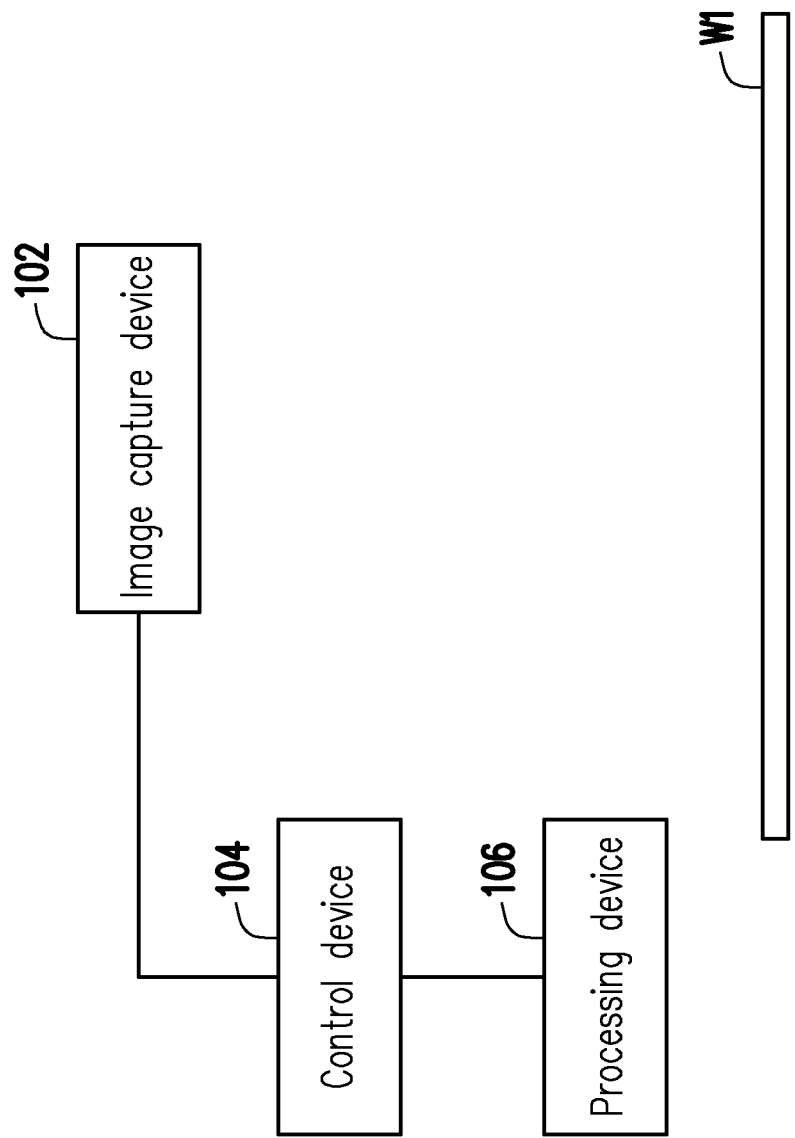
FIG. 1 is a schematic diagram of a wafer processing system according to an embodiment of the disclosure.

FIG. 1 is a schematic diagram of a wafer processing system according to an embodiment of the disclosure. Please refer to FIG. 1. The wafer processing system includes an image capture device 102, a control device 104, and a processing device 106. The control device 104 is coupled to the image capture device 102 and the processing device 106. The image capture device 102 may capture an image of a wafer W1 to generate a captured image. The captured image may be obtained by, for example, automatic optical recognition, wherein the wafer W1 may be, for example, a silicon carbide wafer, but not limited thereto. For example, in some embodiments, the wafer W1 may also be a silicon wafer or a sapphire wafer. The control device 104 may detect a defect pattern in the captured image, wherein contrast values of the defect pattern may indicate a defect depth of the defect pattern. The contrast value may be, for example, at least one of a grayscale contrast value, a lightness contrast value, and a brightness contrast value. The control device 104 may calculate a target removal thickness according to distribution of the contrast values of the defect pattern, and control the processing device 106 to perform processing on the wafer W1 according to the target removal thickness to reduce the defect pattern to meet the requirements of the customer. The processing may be, for example, performing polishing processing, grinding processing, or other processing that may thin the wafer W1.

Figure 2:
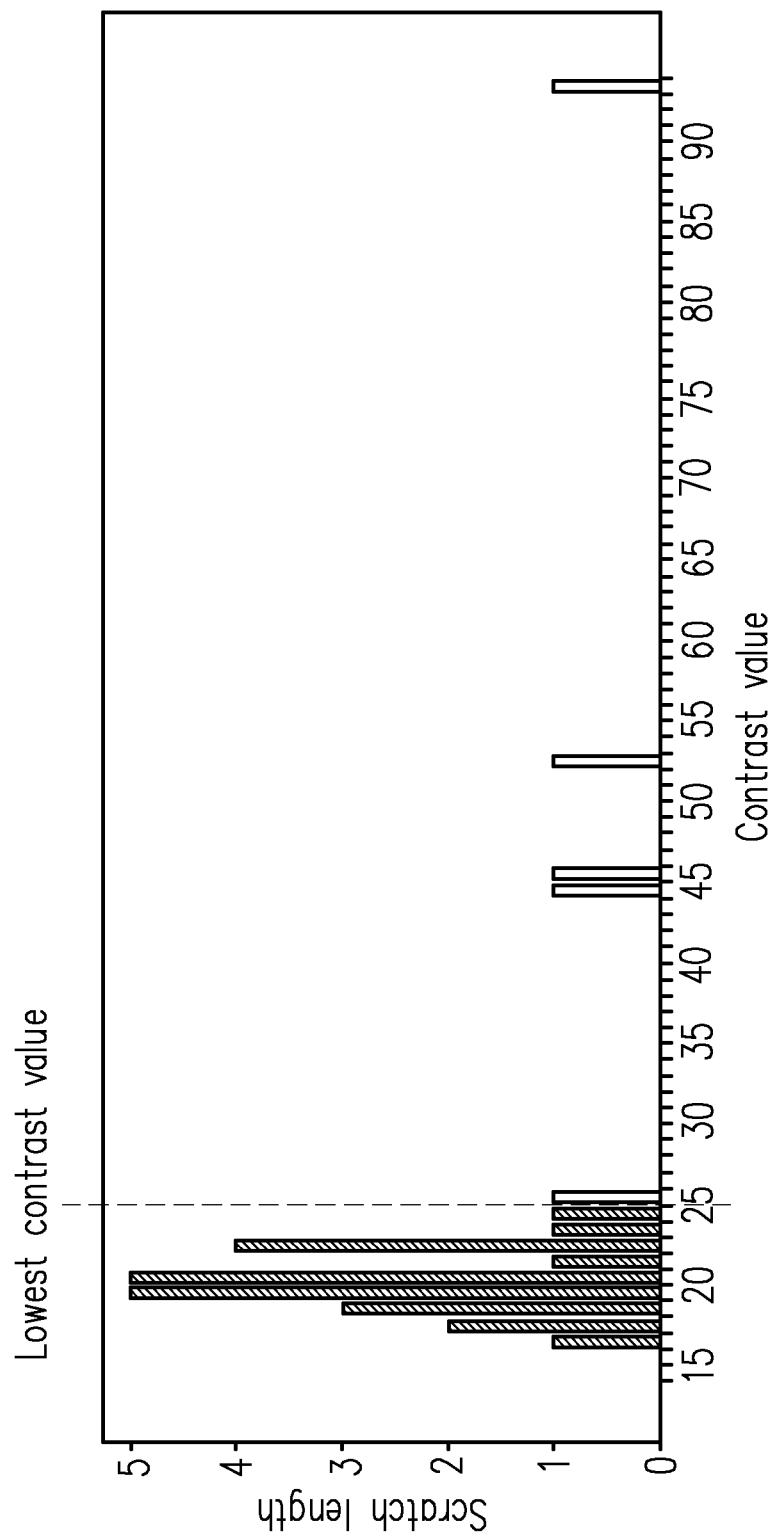
FIG. 2 is a schematic diagram of statistical distribution of scratch lengths of scratches corresponding to different contrast values.

For example, the defect pattern may be scratches on the wafer W1. The scratches with different depths on the wafer W1 show different contrast values in the captured image, for example, the smaller the contrast value, the shallower the depth of the corresponding scratch. The control device 104 may count scratch lengths of different contrast values in the captured image to know the distribution of the scratches with different depths on the wafer W1. For example, FIG. 2 is a schematic diagram of statistical distribution of scratch lengths of scratches corresponding to different contrast values. The scratch lengths of scratches with various depths on the wafer W1 can be known from FIG. 2, that is, the sum of the scratch lengths of all the scratches on the wafer W1 is equal to the sum of the scratch lengths corresponding to the contrast values in FIG. 2.

Generally speaking, the requirements of the customer for the quality of the wafer W1 may be quantified as the sum of the scratch lengths on the wafer W1, that is, the sum of the scratch lengths of all the scratches on the wafer W1 must be less than an upper limit of the sum of the scratch lengths required by the customer. The control device 104 may determine a contrast value reduction amount of the defect pattern according to a defect pattern total length threshold (that is, the upper limit of the sum of the scratch lengths required by the customer) and the distribution of the contrast values of the defect pattern as shown in FIG. 2. Furthermore, a baseline may be set according to the contrast values corresponding to the defect pattern total length threshold. The sum of the scratch lengths corresponding to all the contrast values on the right half of the baseline is the expected sum of the residual scratch lengths after rework. The sum of the scratch lengths corresponding to all the contrast values on the left half of the baseline is the expected sum of the scratch lengths removed after rework. The objective of rework is for the sum of the residual scratch lengths on the right half of the baseline to be less than or equal to the upper limit of the sum of the scratch lengths (the defect pattern total length threshold) required by the customer.

For example, assuming that in FIG. 2, the sum of the scratch lengths of the scratches corresponding to the distribution of the contrast values with a contrast value greater than 25 is less than the defect pattern total length threshold, and the sum of the scratch lengths of the scratches corresponding to the distribution of the contrast values with a contrast value greater than 24 is greater than the defect pattern total length threshold, then the contrast value 25 is the lowest contrast value for the sum of the scratch lengths of the scratches to be less than the defect pattern total length threshold, that is, the lowest contrast value reduction amount required by the defect pattern is 25. The control device 104 may remove a depth (that is, the target removal thickness) corresponding to the contrast value 25 from the wafer W1 through processing, and remove the scratches corresponding to the distribution of the contrast values with the contrast value less than or equal to 25 (that is, remove the scratches corresponding to the distribution of the contrast values on the left side of the dashed line (baseline) in FIG. 2), so that the sum of the scratch lengths of the remaining scratches on the wafer W1 is less than the defect pattern total length threshold, thereby meeting the requirements of the customer.

Figure 3:
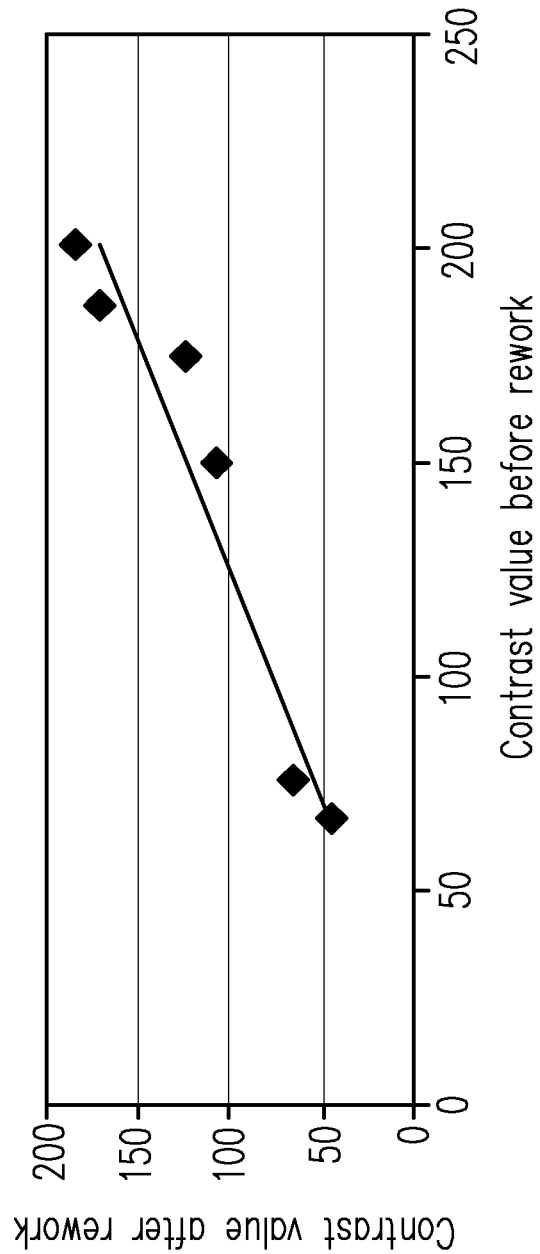
FIG. 3 is a relationship diagram of contrast values of standard wafers before and after rework.

The target removal thickness may be calculated according to the contrast value reduction amount and a contrast value change amount of a standard wafer after removing a unit thickness of the standard wafer. For example, a target removal thickness T may be calculated by the following relation.

$$\frac{\Delta C}{H} = \frac{CA}{T} \qquad (1)$$

where ΔC is the contrast value change amount of the standard wafer before and after rework, H is the removal thickness of the standard wafer, and CA is the contrast value reduction amount of the wafer W1. The test result of a single standard wafer may be adopted for the contrast value change amount ΔC or a predictive model established by the test results of multiple standard wafers may be used to obtain the contrast value change amount ΔC. For example, FIG. 3 is a relationship diagram of contrast values of multiple standard wafers before and after rework. A regression curve may be established by statistical data of multiple contrast value change amounts obtained after removing the unit thickness of multiple standard wafers. Through the regression curve, the contrast values corresponding to the scratches with different contrast values after removing the unit thickness can be known, thereby calculating the contrast value change amount ΔC.

In addition, after obtaining the target removal thickness, the control device may estimate the time for the processing device 106 to perform processing on the wafer W1 according to a thickness removal rate of the wafer W1. In some embodiments, the estimated processing time may also be multiplied by a correction coefficient according to the difference in wafer process parameters to obtain a more accurate estimation result. It is worth noting that different processing or the number of standard wafers affect and change the regression curve, resulting in difference between an expected processing time and an actual processing volume. The processing manner provided by the disclosure may calculate the expected processing time and the actual processing amount required in advance. In addition, coefficients or related parameters contained in the above equation are only exemplary, and the disclosure is not limited thereto.

Figure 4:
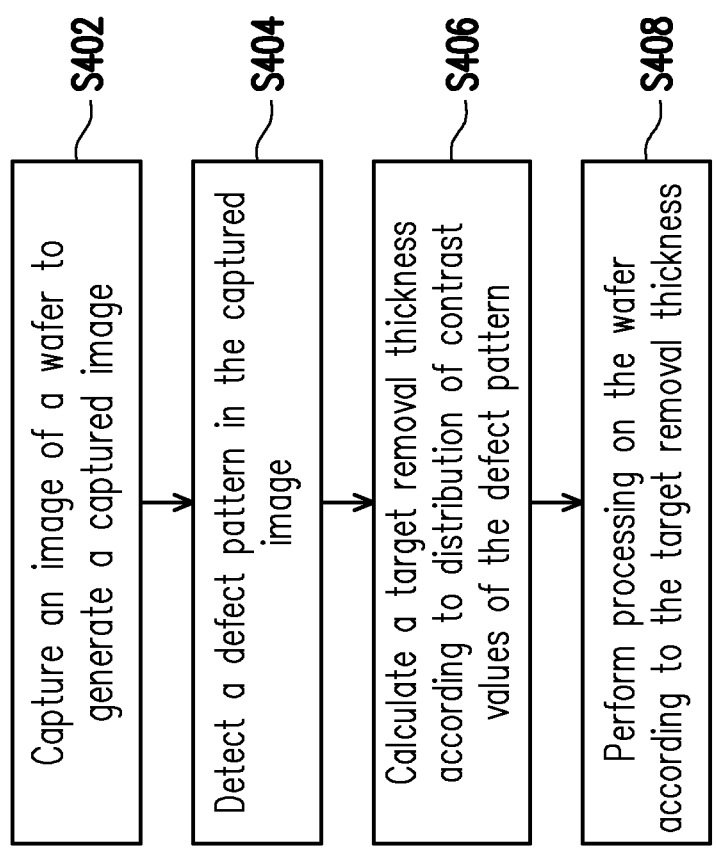
FIG. 4 is a flowchart of a rework method of a wafer processing system according to an embodiment of the disclosure.

FIG. 4 is a flowchart of a rework method of a wafer processing system according to an embodiment of the disclosure. Please refer to FIG. 4. It can be seen from the foregoing embodiment that the rework method of the wafer processing system may at least include the following steps. First, an image of a wafer is captured to generate a captured image (Step S402). The wafer may be, for example, a silicon carbide wafer, but not limited thereto. Then, a defect pattern in the captured image is detected (Step S404). Then, a target removal thickness is calculated according to distribution of contrast values of the defect pattern (Step S406), wherein the contrast value of the defect pattern indicates a defect depth of the defect pattern, and the contrast value may be, for example, at least one of a grayscale contrast value, a lightness contrast value, and a brightness contrast value. Finally, processing is performed on the wafer according to the target removal thickness (Step S408).

For example, the contrast value reduction amount of the defect pattern may be determined according to the defect pattern total length threshold and the distribution of the contrast values of the defect pattern, and the wafer may be processed according to the contrast value reduction amount. Furthermore, the target removal thickness may be calculated according to the contrast value reduction amount and the contrast value change amount of the standard wafer after removing the unit thickness of the standard wafer, wherein the contrast value change amount may be calculated, for example, according to the statistical data of multiple contrast value change amounts obtained after removing the unit thickness of multiple standard wafers. In addition, the time for performing processing may be estimated according to the thickness removal rate of the wafer and the target removal thickness. In some embodiments, the estimated processing time may also be multiplied by the correction coefficient according to the difference in wafer process parameters to obtain a more accurate estimation result. By removing the target removal thickness of the wafer, a total length of the defect pattern may be less than or equal to the defect pattern total length threshold to meet the requirements of the customer for the quality of the wafer.

In summary, in the embodiments of the disclosure, the target removal thickness may be calculated according to the distribution of the contrast values of the defect pattern in the captured image, and the processing device may be controlled to perform processing on the wafer according to the target removal thickness to ensure that the quality of the wafer after performing rework processing can meet the requirements of the customer and avoid repeated inspections during the rework process to avoid waste of processing time and material cost.

What is claimed is:

1. A wafer processing system, comprising:
    an image capture device, capturing an image of a wafer to generate a captured image;
    a processing device; and
    a control device, coupled to the image capture device and the processing device, and the control device is configured to:
    detect a defect pattern in the captured image,
    determine a contrast value reduction amount according to a required upper limit of sum of scratch lengths of the defect pattern and a distribution of scratch lengths and contrast values of the defect pattern, wherein sum of scratch lengths of scratches having contrast value higher than value of the contrast value reduction amount is lower than the required upper limit,
    identify a contrast value change amount of a standard wafer after removing a unit removal thickness of the standard wafer,
    calculate a target removal thickness according to the contrast value reduction amount, the contrast value change amount and the unit removal thickness, and
    control the processing device to perform a processing on the wafer according to the target removal thickness.

2. The wafer processing system according to claim 1, wherein the control device estimates a time for the processing device to perform the processing according to a thickness removal rate of the wafer.

3. The wafer processing system according to claim 1, wherein the contrast value change amount is calculated according to statistical data of a plurality of contrast value change amounts obtained after removing a unit thickness of a plurality of standard wafers.

4. The wafer processing system according to claim 1, wherein the wafer is a silicon carbide wafer.

5. The wafer processing system according to claim 1, wherein the contrast value of the defect pattern indicates a defect depth of the defect pattern.

6. The wafer processing system according to claim 5, wherein the contrast value comprises at least one of a grayscale contrast value, a lightness contrast value, and a brightness contrast value.

7. A rework method of a wafer processing system, comprising:
    capturing an image of a wafer to generate a captured image;
    detecting a defect pattern in the captured image;
    determine a contrast value reduction amount according to a required upper limit of sum of scratch lengths of the defect pattern and a distribution of scratch lengths and contrast values of the defect pattern, wherein sum of scratch lengths of scratches having contrast value higher than value of the contrast value reduction amount is lower than the required upper limit,
    identify a contrast value change amount of a standard wafer after removing a unit removal thickness of the standard wafer,
    calculating a target removal thickness according to the contrast value reduction amount, the contrast value change amount and the unit removal thickness; and
    performing a processing on the wafer according to the target removal thickness.

8. The rework method of the wafer processing system according to claim 7, comprising:
    estimating a time for performing the processing according to a thickness removal rate of the wafer.

9. The rework method of the wafer processing system according to claim 7, wherein the contrast value change amount is calculated according to statistical data of a plurality of contrast value change amounts obtained after removing a unit thickness of a plurality of standard wafers.

10. The rework method of the wafer processing system according to claim 7, wherein the wafer is a silicon carbide wafer.

11. The rework method of the wafer processing system according to claim 7, wherein the contrast value of the defect pattern indicates a defect depth of the defect pattern.

12. The rework method of the wafer processing system according to claim 11, wherein the contrast value comprises at least one of a grayscale contrast value, a lightness contrast value, and a brightness contrast value.

* * * * *